United States Patent [19]

Sanford

[11] 4,286,336
[45] Aug. 25, 1981

[54] AUTOMATIC SHUTDOWN ARRANGEMENT FOR STAND-ALONE TELEVISION MODULATOR

[75] Inventor: Robert F. Sanford, Titusville, N.J.

[73] Assignee: RCA Corporation, New York, N.Y.

[21] Appl. No.: 10,485

[22] Filed: Feb. 8, 1979

[51] Int. Cl.³ .............................................. H04B 1/04
[52] U.S. Cl. .................................... 455/117; 455/127
[58] Field of Search ............... 325/150, 151, 152, 187, 325/185, 186; 332/37 R, 37 D, 38; 455/117, 127

[56] References Cited

U.S. PATENT DOCUMENTS

| | | | |
|---|---|---|---|
| 1,958,994 | 5/1934 | Green | 325/152 |
| 2,064,192 | 12/1936 | Brown | 325/186 |
| 3,169,221 | 2/1965 | Franchi | 325/152 |
| 3,345,570 | 10/1967 | Matyckas | 325/150 |
| 3,365,675 | 1/1968 | Gaddy et al. | 325/151 |
| 3,422,356 | 1/1969 | Fritts | 325/159 |
| 3,832,486 | 8/1974 | Waner | 325/138 |
| 3,900,823 | 8/1975 | Sokal et al. | 330/149 |
| 3,970,968 | 7/1976 | Sly | 332/37 D |
| 4,038,603 | 7/1977 | Bethards | 325/182 |
| 4,112,384 | 9/1978 | Buchberger | 330/141 |

OTHER PUBLICATIONS

LM 1889 TV Video Modulator—Publication of National Semiconductor Nov. 1976.

Primary Examiner—Joseph A. Orsino, Jr.
Attorney, Agent, or Firm—Eugene M. Whitacre; Paul J. Rasmussen; Joseph Laks

[57] ABSTRACT

A carrier generator and modulator has a modulating signal input terminal to which video may be applied from a television camera, a video game or a computer for modulating a carrier on a standard television channel, for producing a visual display of the modulating signal on a standard television receiver. In home applications, there is little control over the maximum amplitude of the video signal which may be applied to the video input. This may allow over-modulation and the production of high-frequency distortion and harmonic signals having excessive amplitude, which may be coupled from the modulator, find their way to and interfere with other standard receivers. An automatic shutdown circuit includes a comparator, the input of which is coupled to the modulating signal input terminal. The comparator removes energizing potential from at least a portion of the carrier generator and modulator in the event that the amplitude of the modulating signal input exceeds a predetermined limit. The carrier generator and modulator is thereby disabled at a modulating signal amplitude less than that at which unwanted distortion occurs.

4 Claims, 8 Drawing Figures

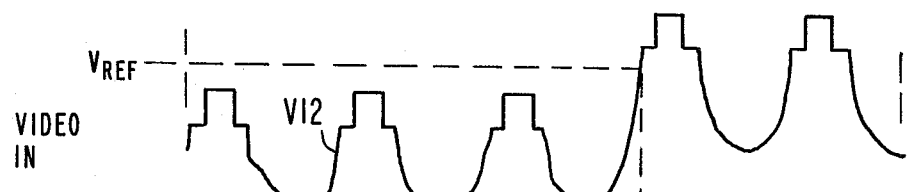
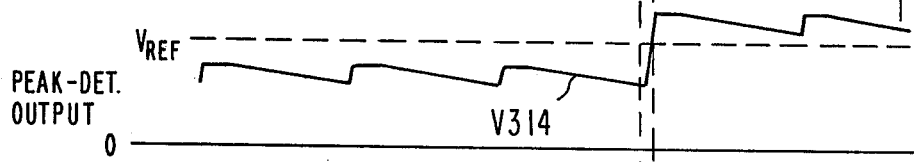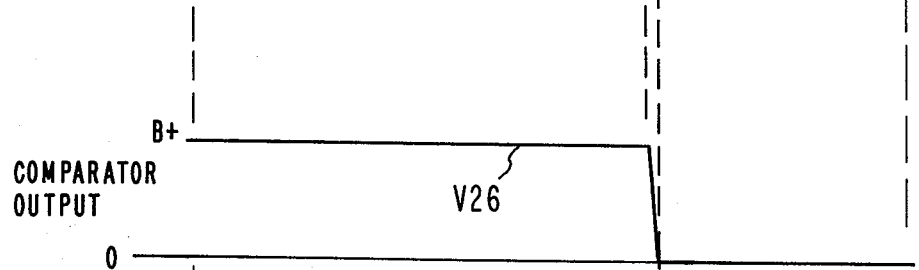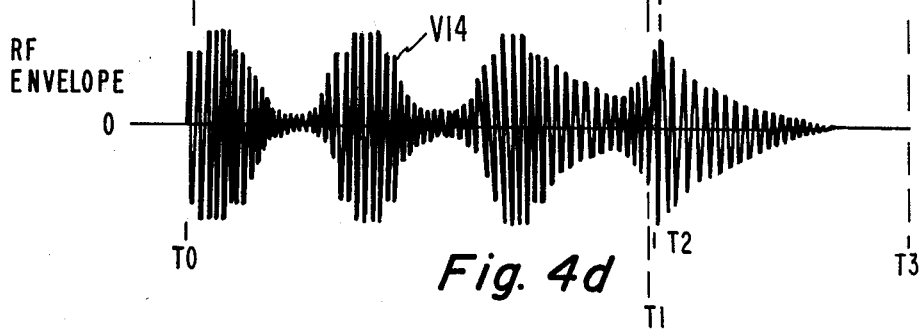

AUTOMATIC SHUTDOWN ARRANGEMENT FOR STAND-ALONE TELEVISION MODULATOR

BACKGROUND OF THE INVENTION

This invention relates to an arrangement for preventing the generation of unwanted spurious radio-frequency outputs by a television modulator such as those used in the home for modulating the output of a video game, computer, television camera or the like onto a standard television channel.

The common television receiver is adapted to select from among a number of television channels, and to receive within the passband of the selected channel a radio-frequency carrier signal modulated with video information which information may be displayed on a picture tube or kinescope. The kinescope and its associated drive circuitry are relatively expensive.

Of late, the marketplace has made available a number of devices which produce information in the form of video signals representing images or graphic information. Such devices include home computers, surveillance cameras and video games. These devices are normally not supplied with a self-contained visual display or with a remote video display device responsive to the video signals. Instead, the cameras, games and computers incorporate television carrier generators and modulators, by which a television-channel picture carrier is generated and modulated with the video signal containing the information to be displayed. Such a video source, carrier generator and modulator is described in U.S. Pat. No. 3,832,486 issued Aug. 27, 1974 to Wanek.

The Federal Communications Commission (FCC) has jurisdiction over devices which generate radio-frequency signals, and the manufacturers of video games, cameras and the like incorporating carrier generators and modulators must obtain approval of the devices from the FCC before marketing can begin. Obtaining approval is time-consuming and inconvenient, and may be injurious to the competitive position of the manufacturer of such a device if not quickly obtained.

Just as the manufacturers of video information devices find it economic to take advantage of the availability of a television receiver to the prospective user of their device, it would be desirable for the consumer who wishes to display video information to have but a single carrier generator and modulator. Thus, the consumer would be spared the expense of purchasing a carrier generator and modulator as an integral portion of each of the video information sources which he wishes to display. The manufacturers of video sources likewise would be spared the necessity of seeking approval from the FCC for each device. Such a stand-alone carrier generator and modulator (hereinafter referred to as a TV modulator) would have a video input terminal to which any of the numerous sources of video signals could be coupled by the consumer, and the video information contained in the signals would be modulated onto an appropriate television channel for selection and display by the television receiver.

With many sources of video information available, any one of which may be coupled to the video input terminal of the stand-alone TV modulator, the possibility arises that video signals having unacceptable characteristics such as excessive amplitude could be coupled to the video input terminal of the modulator. This might give rise to improper operation of the TV modulator. Excessive amplitude of the video input signal, for example, may result in the generation of unwanted spurious outputs outside the passband of the television channel in which it is desired that the information appear. Such spurious outputs may be coupled as is known in the art to nearby television receivers and interfere with reception on those receivers.

It is known to provide automatic control of the amplitude of the carrier signal generated by the carrier generating and modulating arrangement as described in U.S. Pat. No. 3,641,451 issued Feb. 8, 1972 to Hollingsworth, et al., and U.S. Pat. No. 3,866,136 issued Feb. 11, 1975 to Augustin, et al., but this cannot prevent the appearance of spurious signals outside of the prescribed passband in the presence of an excessively large modulating signal. It is also known to use an automatic gain control (AGC) for automatic control of the amplitude of a video signal applied to the modulator in order to prevent spurious outputs from becoming large, but such automatic gain control arrangements have only a limited range. If the limited range of attenuation of such an AGC system is exceeded by an abnormally large video signal applied to the video input terminal of the TV modulator, the signal applied to the modulator portion may be sufficiently large to allow the undesired spurious signals to be generated.

It is desirable to have a stand-alone TV modulator adapted to receive a video input from a wide variety of sources but which will not produce undesirable spurious signals regardless of the amplitude of the video signal applied to the modulation input.

SUMMARY OF THE INVENTION

A TV modulator for modulating a signal carrier with a modulating signal applied to a modulating signal input includes a carrier generator and a modulator arrangement coupled to the modulating signal input for generating the signal carrier and for modulating the signal carrier to produce a signal within a predetermined frequency range about the carrier in response to the amplitude of the modulating signal. The carrier generator and modulator arrangement, however, generates significant signals outside the predetermined frequency range when the amplitude of the modulating signal is outside a predetermined range. A comparator having first and second switching states is coupled to a source of energizing potential or voltage, to the carrier generator and modulator arrangement and is also coupled to the modulating signal input for applying energizing potential to at least a portion of the carrier generating and modulating arrangement when the comparator is in the first switching state. The first switching state occurs when the amplitude of the modulating signal is within the predetermined range. The comparator removes energizing potential from the carrier generating and modulating arrangement in its second switching state, which occurs when the amplitude is outside the predetermined range.

DESCRIPTION OF THE DRAWING

FIG. 4 illustrates as amplitude-time plots certain signal inputs and outputs, and internal voltage waveforms useful in describing the operation of the embodiments of FIGS. 3 and 5.

DESCRIPTION OF THE INVENTION

Figure 1:
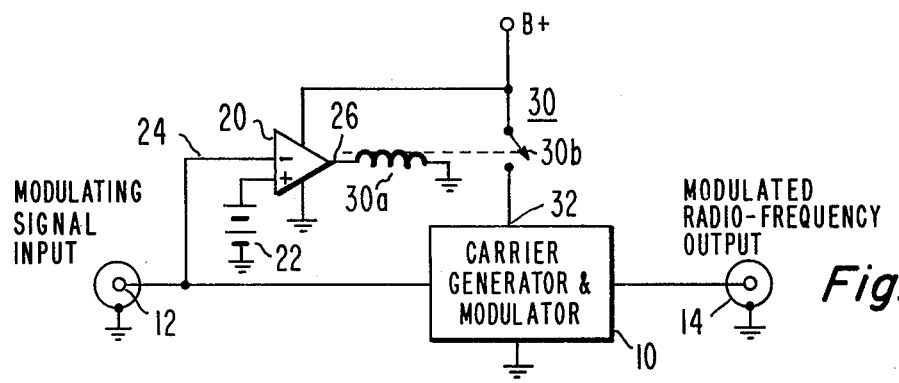
FIGS. 1, 2, 3 and 5 depict in schematic and block diagram form TV modulators embodying the invention.

FIG. 1 illustrates a TV modulator including a carrier generator and modulator illustrated as a block 10 and having its input coupled to an input terminal 12 illustrated as being of coaxial form. When energized, carrier generator and modulator 10 produces a radio-frequency (RF) voltage or signal amplitude-modulated by the amplitude of the video signal voltage applied from an external source (not shown) to modulating signal input 12. The modulated carrier is coupled from carrier generator and modulator 10 to a modulated radio-frequency signal output terminal 14, also illustrated as being coaxial, for application to a television receiver, not shown.

In accordance with the invention, a comparator 20 is energized by a source B+ of operating voltage or potential. The noninverting (+) input terminal of comparator 20 is coupled to a reference voltage source illustrated as a battery 22, the other end of which is grounded. The inverting (−) terminal of comparator 20 is coupled by way of a conductor 24 to input terminal 12 for rendering comparator 20 responsive to the amplitude or magnitude of the video signal applied to terminal 12. Thus, when the signal applied to input terminal 12 is less than (more negative than) the voltage of battery 22, comparator 20 assumes a first switching state with its output terminal 26 at a high (positive) voltage near B+. Output terminal 26 of comparator 20 is coupled to one end of a coil 30a of a relay 30. The other end of coil 30a is connected to ground. Relay 30 also includes a normally-nonconductive or normally-open contact 30b. Contact 30b has one end connected to B+ and the other end connected to an energizing potential or voltage input 32 of carrier generator and modulator 10.

In normal operation with the video signal applied to terminal 12 more negative than the reference voltage supplied by battery 22, comparator 20 assumes its first switching state with the voltage at output terminal 26 high, as mentioned. With terminal 26 near B+, a voltage is applied across winding 30a and contact 30b is consequently closed. With contact 30b closed, B+ is applied to the energizing voltage input of carrier generator and modulator 10 for enabling the carrier generator and modulator for normal operation.

In the event that the video signal applied to terminal 12 exceeds the voltage at battery 22, comparator 20 assumes a second switching state in which output terminal 26 is at a low or ground potential. This deenergizes winding 30a and allows normally open contacts 30b to open, thereby decoupling carrier generator and modulator 10 from B+. This completely inhibits further operation of the unit, and spurious output signals cannot be generated.

Figure 2:
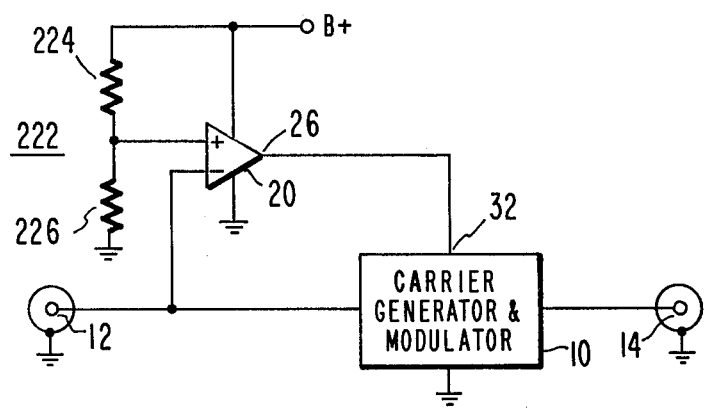

The electromechanical relay illustrated in FIG. 1 is expensive, relatively slow in operation, and its cost and bulk render it rather unsuitable for reliable low cost, miniaturized home equipment. The arrangement of FIG. 2 utilizes the output of the comparator directly and thus eliminates the need for the relay. In FIG. 2, elements corresponding to those of FIG. 1 are assigned the same reference number. In FIG. 2, a reference voltage source designated generally as 222 is substituted for battery 22 of FIG. 1. Source 222 includes resistors 224 and 226 serially coupled between the B+ terminal and ground to form a voltage divider. The noninverting input of comparator 20 is coupled to the tap of the voltage divider. Output terminal 26 of comparator 20 is direct-coupled to terminal 32 of carrier generator and modulator 10.

When the instantaneous video signal voltage applied to input terminal 12 is less than the reference voltage established by source 222, comparator 20 will be in a first switching state in which the voltage at output terminal 26 is high. Thus, comparator 26 supplies the current for carrier generator and modulator 10 directly. In the event that the instantaneous voltage of the input signal exceeds the reference voltage established by source 222, comparator 26 assumes a second switching state in which the voltage at terminal 26 is low, and carrier generator and modulator 10 is deenergized, just as in the arrangement of FIG. 1.

The NTSC television signals which may be expected to be applied to input terminal 12 include synchronizing-signal portions and video information portions. These portions are normally assigned to different voltage ranges of the video signal. Thus, the video signal can be expected to alternate rapidly between different voltage levels. So long as the peak magnitude of the video signal applied to comparator 20 in the arrangements of FIGS. 1 and 2 does not exceed the reference voltage, B+ will continue to be applied to the carrier generator and modulator. If the applied signal is grossly excessive, even the smallest-amplitude portions will exceed the reference level, and the comparator will remain in the second switching state and the carrier generator and modulator will be deenergized. However, there may be many cases in which the video signal applied to the modulating signal input may be of such a magnitude that only portions of the signal exceed the reference voltage level. In this event, the comparator will switch rapidly between its two states, thereby energizing and deenergizing carrier generator and modulator 10 at a high rate. Recurrent switching of carrier generator and modulator 10 may also be a cause of generation of spurious signals.

Figure 3:
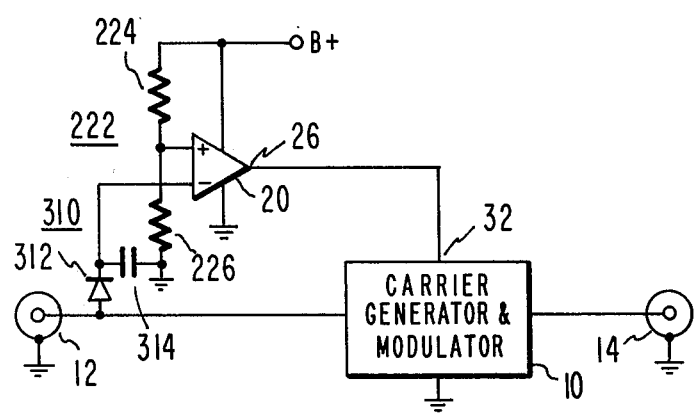

The arrangement of FIG. 3 includes a peak detector which allows carrier generator and modulator 10 to be deenergized continuously so long as any portion of the video input signal exceeds the reference level. In FIG. 3, elements corresponding to those of FIGS. 1 and 2 are provided with the same reference numbers. In FIG. 3, a peak detector designated generally as 310 includes a diode 312 having its anode coupled to terminal 12 and its cathode connected to the inverting input terminal of comparator 20. A filter capacitor 314 couples the cathode of diode 312 to ground.

In normal operation with signals less than the forward junction offset potential of diode 312, diode 312 does not conduct, and capacitor 314 remains deenergized. Thus, the inverting input terminal of comparator 20 is held near ground and comparator 20 remains in a first switching state in which terminal 26 has a high voltage. Thus, with a small input voltage, carrier generator and modulator 10 operates normally.

At somewhat larger magnitudes of input video, but still within the normal operating range of modulator 10, as illustrated by V12 in FIG. 4a in the interval T0–T1, diode 312 will conduct and charge capacitor 314 to a peak voltage offset by 1 Vbe from the peak voltage of video input signal V12. The voltage V314 across capacitor 314 under this operating condition is illustrated in FIG. 4b in the interval T0–T1. The pulsations in voltage 314 result from recurrent charging of capacitor 314 during the peaks of the video signal together with a slow discharge in the interval between the peaks due to input currents in the comparator, leakage and the like. So long as the voltage across capacitor 314 does not exceed the reference voltage applied to the noninverting terminal of comparator 20, comparator 20 will remain in its first switching state corresponding to normal operation. Output voltage V26 of comparator 20 is illustrated in FIG. 4c as being near B+ in the first switching state.

Carrier generator and modulator 10 is energized by voltage V26 in the interval T0–T1 and responds to modulating signal V12 by producing a modulated radio-frequency carrier, as illustrated by V14 of FIG. 4d.

In the event that the peak value of the input video or modulating signals is large enough, as illustrated in FIG. 4a in the interval T1–T2, to raise the voltage across capacitor 314 to a value greater than the reference voltage, as illustrated by V314 of FIG. 4b in the interval T2–T3, comparator 20 will switch to its second switching state. In its second switching state, output voltage V26 of comparator 20 decreases to zero, as illustrated in FIG. 4c, whereby modulator 10 is deenergized, its output decreases to zero as illustrated in FIG. 4d and spurious outputs are avoided.

Figure 5:
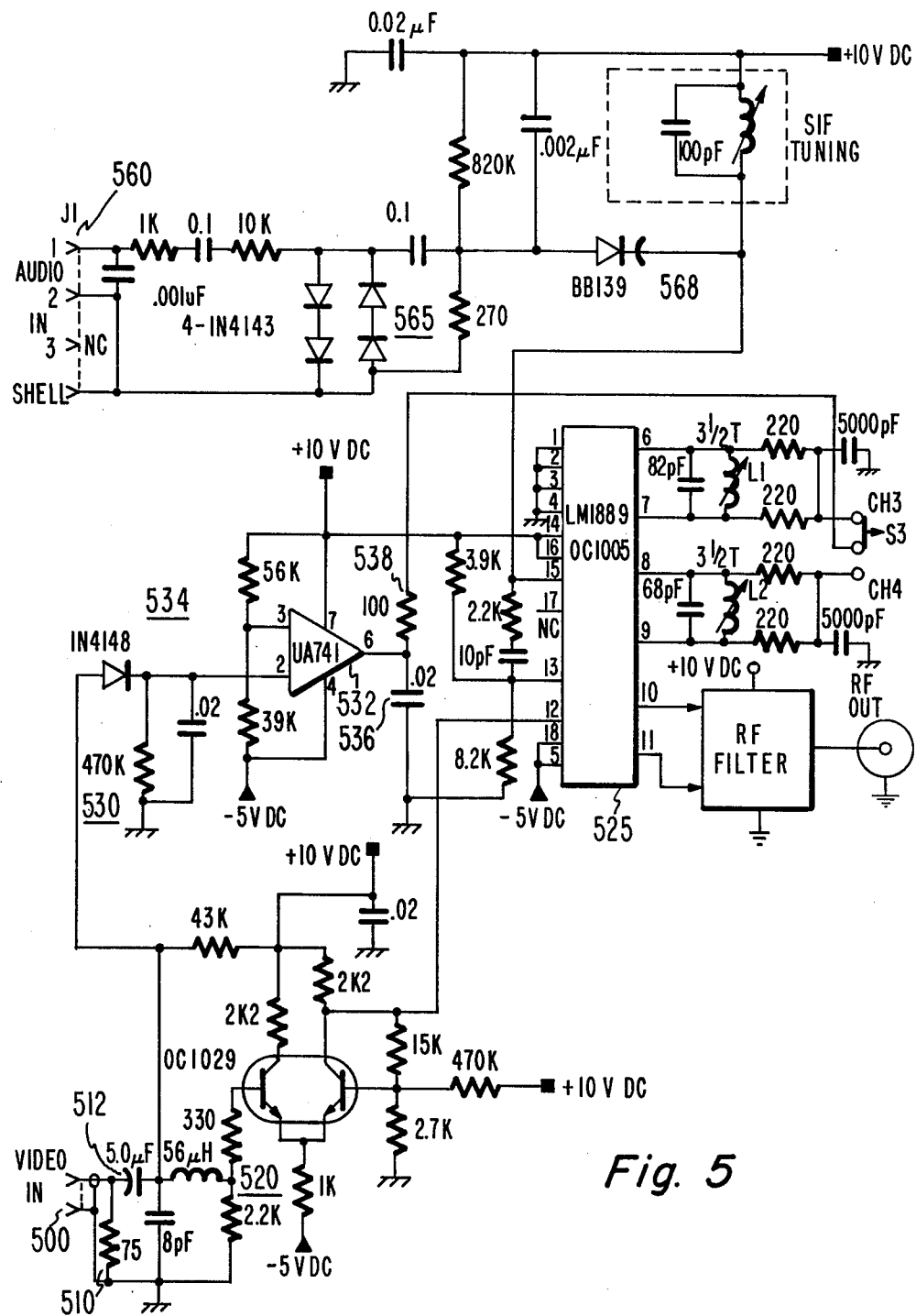

FIG. 5 is a detailed diagram of a preferred embodiment of the invention. In FIG. 5, a video input jack 500 at lower left is coupled by a termination 510 and a blocking capacitor 512 to a differential amplifier designated generally as 520, the noninverting output of which is coupled to pin 12 of an integrated circuit (IC) 525. Amplifier 520 increases the amplitude of the input signal to the 6 volts peak-to-peak required by IC 525. IC 525 is a type LM 1889 produced by National Semiconductor Corp., 2900 Semiconductor Drive, Santa Clara, Calif. 95051. Jack 500 is also coupled by capacitor 512 to a peak detector 530, the output of which is coupled to the inverting input of a comparator 532. A reference voltage source 534 is coupled to the noninverting input of comparator 532. Output pin 6 of comparator 532 is filtered by a bypass capacitor 536. The voltage at pin 6 is coupled through a low-value resistor 538 to a switch S3. Switch S3 applies the output of comparator 532 selectively to either the channel 3 or channel 4 oscillator portions of IC 525 at pins 6, 7 or 8, 9, respectively. These pins also couple frequency-determining resonant circuits to the IC. The TV modulator is arranged to selectively produce a modulated carrier or either television channel 3 or 4.

An audio input jack 560 accepts an external input and couples it to an amplitude limiter 565 consisting of anti-paralleled diodes. From limiter 565, audio signals are coupled to a varactor diode 568 which produces a change in capacitance as a function of the audio signal. The capacitance change is used to frequency-modulate a sound carrier oscillator, which is coupled to a video-audio combiner for combining the signals to be modulated onto the RF carrier.

A radio-frequency carrier modulated with video information and with a frequency-modulated sound carrier is produced at terminals 10 or 11 of IC 525 and coupled by way of a channel filter to an output terminal.

In the arrangement of FIG. 5, power for one of the channel oscillators is supplied by the level comparator. Should an excessive video signal input be applied to jack 500, the channel oscillator is deenergized, preventing the generation of spurious RF outputs.

Other embodiments of the invention will be apparent to those skilled in the art. For example, carrier generator and modulator 10 may be reduced to its component stages and individual component stages may be selectively deenergized, as in the FIG. 5 arrangement, rather than deenergizing all such stages together. Rather than decoupling carrier generator and modulator 10 from B+, deenergization may instead be achieved by decoupling it from ground. A high-gain amplifier may serve in the place of a comparator, and the reference voltage source may be made adjustable and or temperature-compensated for the temperature-dependent changes in switching point resulting from diode 312.

What is claimed is:

1. A stand-alone modulator for modulating a signal carrier with a video information modulating signal obtained from a selected video signal source and applied to a modulating signal input terminal capable of being connected to any one of a plurality of video signal sources, including overmodulation protection circuitry, comprising:

a source of energizing potential;

carrier generating and modulating means coupled to said modulating signal input terminal for generating said signal carrier and modulating said signal carrier in response to variations in the amplitude of said video information modulating signal obtained from said selected one signal source, said carrier generating and modulating means when energized by said energizing potential capable of being operated in an overmodulated condition to overmodulate said signal carrier when the amplitude of said video information modulating signal exceeds a predetermined overmodulation level;

comparator means having first and second switching states, said comparator means being coupled to said source of energizing potential and having an output terminal coupled to said carrier generating and modulating means for applying said energizing potential to at least a portion of said carrier generating and modulating means when said comparator means is in said first switching state when said amplitude of said video information modulating signal is below said predetermined overmodulation level;

means for developing a voltage representative of the amplitude of said video information modulating signal;

means for developing a reference voltage representative of an amplitude of said video information modulating signal that is capable of producing said overmodulated condition; and means for applying the above two recited representative voltages to said comparator means to switch said comparator means into said second switching state upon the occurrence of said overmodulated condition, said comparator means removing energizing potential from said carrier generating and modulating means when in said second switching state, thereby providing overmodulation protection.

2. A modulator according to claim 1 wherein said comparator means includes a relay having a mechanical switch portion interposed between said source of energizing potential and said output terminal and having a coil portion energized when said comparator means is in one of said first and second switching states for enabling said mechanical switch to apply energizing potential to at least a portion of said carrier generating and modulating means when said comparator means is in said first switching state and to remove energizing potential when in said second switching state.

3. A modulator according to claim 1 wherein said means for developing a voltage representative of the amplitude of said video information modulating signal comprises a peak detector having an input terminal coupled to said modulating signal input terminal and having an output terminal coupled to an input terminal of said comparator means for detecting the amplitude of said video information modulating signal.

4. A modulator according to claim 1 wherein said carrier generating and modulating means includes first and second carrier channel LC resonant circuit, a selector switch coupled to said first and second carrier channel resonant circuits and to said output terminal of said comparator means for applying said energizing potential to a selected one of said first and second carrier channel resonant circuits when said comparator means is in said first switching state and means for producing oscillation of said selected one resonant circuit upon application of said energizing potential to said selected one resonant circuit to generate said signal carrier at a frequency determined by the resonant frequency of said selected one resonant circuit, said comparator means removing said energizing potential from said selected one resonant circuit to stop said oscillation when in said second switching state to provide said overmodulation protection.

* * * * *

UNITED STATES PATENT AND TRADEMARK OFFICE
CERTIFICATE OF CORRECTION

PATENT NO. : 4,286,336

DATED : August 25, 1981

INVENTOR(S) : Robert F. Sanford

It is certified that error appears in the above-identified patent and that said Letters Patent is hereby corrected as shown below:

Col. 7, line 13, "circuit" should read -- circuits --.

Signed and Sealed this

Second Day of March 1982

[SEAL]

Attest:

GERALD J. MOSSINGHOFF

Attesting Officer

Commissioner of Patents and Trademarks